United States Patent [19]

Takata et al.

[11] Patent Number: 4,652,902
[45] Date of Patent: Mar. 24, 1987

[54] POWER SEMICONDUCTOR DEVICE

[75] Inventors: Ikunori Takata; Takayuki Kitamura, both of Itami, Japan

[73] Assignee: Mitsubishi Denki Kabushiki Kaisha, Tokyo, Japan

[21] Appl. No.: 684,917

[22] Filed: Dec. 21, 1984

[30] Foreign Application Priority Data

Jan. 23, 1984 [JP] Japan .................................. 59-10572

[51] Int. Cl.$^4$ ........................................... H01L 27/02
[52] U.S. Cl. .................................. 357/46; 357/23.13; 357/41; 357/39; 357/86
[58] Field of Search .................. 357/46, 38, 39, 23.13, 357/41, 86

[56] References Cited

U.S. PATENT DOCUMENTS

| | | | |
|---|---|---|---|
| 3,636,385 | 1/1972 | Koepp | 357/41 |
| 3,947,864 | 3/1976 | Yatsuo et al. | 357/39 |
| 3,978,514 | 8/1976 | Ogawa et al. | 357/39 |
| 4,521,795 | 6/1985 | Coe et al. | 357/23.4 |
| 4,530,000 | 7/1985 | van de Wouw et al. | 357/46 |

FOREIGN PATENT DOCUMENTS 194700  11/1981  Japan .................................. 357/81
58-93363 (A)  6/1983  Japan .................................. 357/81

OTHER PUBLICATIONS

Motorola, Inc., *The Semiconductor Data Book*, 2nd ed., 1966, pp. 16-104.

*Primary Examiner*—Martin H. Edlow
*Attorney, Agent, or Firm*—Lowe Price LeBlanc Becker & Shur

[57] ABSTRACT

The present invention comprises a power semiconductor device in which a bipolar transistor and a diode are formed in antiparallel in a semiconductor chip with an emitter electrode (21) on one surface of the transistor (16) serving also as an anode electrode of the diode and a collector electrode (23) on another surface of the transistor serving also as a cathode electrode of the diode. A plurality of emitter lead wires (24) of the power transistor serving also as anode lead wires of the diode are connected in the anode region of the diode. Thus, electric current is made to flow from the anode region of the diode to the cathode thereof if a short circuit occurs, so that the lead wires can be prevented from being melted by large current.

5 Claims, 16 Drawing Figures (a) ○ ALUMINUM WIRE SHORT
× ALUMINUM WIRE OPEN (b) ▲ SILVER LEAD WIRE SHORT
△ SILVER LEAD WIRE OPEN (c) ◉ ALUMINUM WIRE SHORT
⊗ ALUMINUM WIRE OPEN
(THICKNESS OF CHIP ALUMINUM IS INCREASED TWICE)

(d) ☆ ALUMINUM WIRE SHORT
(IN THE CASE THE BROKEN RETURN CURRENT DIODE)

POWER SEMICONDUCTOR DEVICE

BACKGROUND OF THE INVENTION

1. Field of the Invention

The present invention relates to a power semiconductor device. More particularly, the present invention relates to the structure of a power semiconductor device in which a bipolar transistor and a diode are formed 'antiparallel' within the same semiconductor chip, the above stated power semiconductor device being applied to an inverter circuit and the like. As the term is used herein 'antiparallel' means a parallel connection in such a way that the current conducting directions of the respective devices are opposite each other.

2. Description of the Prior Art

FIG. 1 is an electric circuit diagram of an ordinary conventional inverter circuit and FIG. 2 is a waveform diagram for explaining the operation of the circuit in FIG. 1.

In FIG. 1, an emitter of a transistor 1 is connected with a collector of a transistor 2 and an emitter of a transistor 3 is connected with a collector of a transistor 4. A DC power source 9 is connected between the collector of the transistor 1 and the emitter of the transistor 2 as well as between the collector of the transistor 3 and the emitter of the transistor 4. A capacitor 11 is connected to the DC power source 9 in parallel. The transistors 1, 2, 3 and 4 are connected in antiparallel to the diodes 5, 6, 7 and 8, respectively, so that return current may flow therethrough respectively.

In the inverter circuit having the above described structure, voltage is applied to the load 10 as shown typically in FIG. 22 and in a period 'a' in which load voltage is applied in the positive direction. The transistors 1 and 4 conduct and transistors 2 and 3 are inactive. The output control of the load 10 can be determined by the ratio of the conducting period and the interrupting period 'b' of the transistors and by the state of conduction of either group of transistors 1 and 4 or transistors 2 and 3. During the interrupting period b, the diodes 5–8 are respectively connected in antiparallel to the operating transistors 1 to 4. This can be attained by interrupting the contact of the conducting transistors 1 and 4. However, if the load includes an inductance component, counter electromotive force is applied the cause to flow of electric current having the same current value as that of the current flowing in the load 10 in the period b and the period a. Due to this counter electromotive force, electric current flows in the diodes 6 and 7 and by return of this current to the DC power source 9, the current value in the load 10 becomes constant and the voltage applied to the load 10 is reversed. In the period a' and the period b' in FIG. 2, electric current flows in the diodes 5 and 8.

In the inverter circuit in FIG. 1, the voltage of the DC power source is generally approximately ⅔ of the rated voltage of the transistors 1, 2, 3 and 4. As a result, if a short circuit occurs in the inverter circuit, a large current flows in the transistors 1, 2, 3 and 4 in the state in which high voltage is applied thereto, resulting in distribution of transistors 1, 2, 3 and 4 in an extremely short period. If the transistors 1, 2, 3 and 4 are destroyed, the extremities of the chips of the transistors are generally melted, bringing about a short-circuited state between the associated collectors and emitters. In the event of short circuit, a protection circuit generally functions in the inverter circuit so that operation of the DC power source is interrupted. However, if the time required for interrupting the contact of the DC power source 9 is long, or if the capacitor 11 connected to the DC power source 9 has a large capacity, the lead wires connecting the emitter electrodes of the chips of the transistors 1, 2, 3 and 4 are easily melted and it sometimes happens that an open state occurs between the associated bases and emitters. After melting of the emitter lead wires, electric current applied from the DC power source 9 flows from the collectors to the bases of the transistors. Since this electric current is relatively large and the collector-base contact is sometimes broken, voltage from the DC power source 9 is caused to be applied directly to the bases and the base-drive circuit is easily broken, causing sometimes firing, which is a serious problem.

FIG. 3 is a circuit diagram of an apparatus by which a lead wire melting test is applied to a bipolar transistor employed in the inverter circuit of FIG. 1. FIG. 4 is a graph showing the results of the lead wire melting test.

Referring to FIG. 3, available DC power source 13 is connected to a resistor 14, between a collector and an emitter of a transistor 12 subjected to the test, and a capacitor 15 is connected in parallel with a series circuit comprising the resistor 14 and the variable DC power source 13.

FIG. 4 shows the results of examination of the phenomenon of the lead wires of the above described transistor in the testing circuit shown in FIG. 3. In FIG. 4, the horizontal axis represents the total cross-sectional area of the lead wires and the vertical axis represents energy ($CVV/2$) stored in the capacitor 15. The character a in FIG. 4 indicates resistance of an aluminum wire to melting, the character b indicates resistance of a silver lead wire to melting and the character c indicates resistance of an aluminum wire to melting in case where the thickness of a chip aluminum electrode is increased twice as much. The character d will be specifically described later.

Generally, resistance of a transistor to breakage is increased if the number of lead wires is increased or the thickness thereof is made large, but the resistance is decreased if the capacity of the capacitor 15 is increased. If the thickness of the emitter electrode is increased, little change will be caused in the resistance. As a result, it can be said that for a transistor to which aluminum lead wires are attached by supersonic bonding, it is extremely difficult to resist melting in case of an ordinary capacity of a capacitor. By contrast, a transistor to which silver lead wires are attached by soldering can have resistance several times as much as that of a transistor using aluminum lead wires.

However, a transistor including lead wires attached by soldering has numerous disadvantages, such as low productivity, low reliability of a chip or an assembly structure, or poor chip performance characteristics due to the fact that a fine pattern cannot be formed. Accordingly, at present, most power transistors are manufactured by bonding of aluminum wires.

FIG. 5 is a perspective view of an example of aluminum wire bonding in a conventional transistor. FIG. 6 is a sectional view taken along the line VI—VI shown in FIG. 5. FIG. 7 is a sectional view of a conventional transistor in which lead wires are attached by soldering.

Referring to FIGS. 5 and 6, a transistor chip 16 is structured by forming a collector low impurity concentration region 18 on a collector high impurity concentration region 17 and by forming thereon a base region 19 and a emitter region 20 successively. In the collector high impurity concentration region 17, a collector electrode 23 is formed; in the base region 19, a base electrode 22 is formed; and in the emitter region 20, an emitter electrode 21 is formed. An emitter lead wire 24 is connected to the emitter electrode 21 and a base lead wire 25 is connected to the base electrode. In FIG. 6, the arrows indicate distribution of electric current flowing in the emitter. FIG. 7 is a state in which an emitter lead wire 24 is attached to the emitter electrode 21 by solder 241.

As a result of the test using the melting test apparatus shown in FIG. 3, it was determined that the resistance to melting of a soldered aluminum lead wire and that of a soldered silver lead wire cannot be explained only by the difference of conductible current capacity of the aluminum lead wire and that of the silver lead wire. This difference should be considered as follows. The portion where the path for emitter current in case of aluminum wire bonding is smallest, causing melting most often is considered to be the peripheral portion of the wire bonding portion in the emitter aluminum electrode 21 on the chip 16. The reasons for this are that the thickness of the aluminum electrode is 4 μm to 6 μm while the diameter of an aluminum wire is generally 300 μm to 400 μm and that lead wire melting resistance depends on the length of the peripheral portion of the aluminum wire bonding portion because of the fundamental structure in which, as shown by the arrows in FIG. 6, electric current in the transistor chip 16 hardly flows under the emitter bonding pad and the electric current flowing into the finger portion of the emitter region 20 is collected to the lead wire 24 through the aluminum electrode 21.

As for resistance to melting in the peripheral portion of the wire bonding portion, a noticeably advantageous structure is adopted in a lead wire soldering system as compared with an aluminum wire system since a solder layer of several tens of μm to several hundreds of μm is formed around a lead wire attached by soldering. The above described consideration is supported by the below described results of an experiment.

FIG. 8 is a perspective view of an example in practical use of a conventional transistor for an inverter; FIG. 9 is a diagram of an equivalent circuit; and FIG. 10 is a sectional view of a return current diode.

The transistor for the inverter in FIG. 8 comprises a collector electrode 23 on which a base electrode 22' and an emitter electrode 21' are formed through an insulating plate 29 and through an insulating plate 29, 30, respectively, and a monolithic Darlington transistor chip 26 and a return current diode chip 28 are formed. On the base electrode 22, a speed-up diode chip 27 is formed and on the monolithic Darlington transistor chip 26, a resistor portion 31 is formed.

When a complex device having a structure in which the above described return current diode chip 28 as in FIG. 8 is disposed adjacent the transistor chip 26 is subjected to a test in the testing circuit of FIG. 3, melting resistance in an aluminum wire system was in some cases equal or higher than that in a lead wire soldering system, as shown in FIG. 4'd. Thus, if an aluminum wire system exhibits almost the same melting resistance as that of a lead wire soldering system, there is a distinctive characteristic that the return current diode 28 is broken. The breakage of the return current diode 28 can be regarded as being caused when the transistor chip 26 is violently broken since the return current diode 28 is in close contact with the transistor chip 26. In such a case, the emitter wire of the transistor chip 26 is melted, while the wire of the return current diode 28 is hardly melted, large current flowing in the broken return current diode 28.

The return current diode 28 comprises, as shown in FIG. 10, a cathode low impurity concentration region 33 formed on a cathode high impurity concentration region 32 and an anode region 34 formed thereon. A cathode electrode 36 is formed on the cathode high impurity concentration region 32 and an anode electrode 35 is formed on the anode region 34. An end of an anode lead wire 37 is connected to the anode electrode 35 and the other end of the anode lead wire 37 is connected to an emitter electrode 21'. When the return current diode 28 is broken, electric current flows in the direction shown by the arrows in FIG. 10. As is clear from FIG. 10, the electric current flowing at the time of breakage of the return current diode 28 becomes largest immediately under the wire bonding and it is considered that the reason why the wire of the diode hardly melts is that the contact area functions effectively while in case of a transistor, melting is caused dependently on the peripheral length of the contact of the wire bonding portion.

SUMMARY OF THE INVENTION

Therefore, a primary object of the present invention is to provide a power semiconductor device in which a power active device for use in an inverter and the like and a diode are connected in parallel in the same semiconductor chip to have opposite polarities so that a large electric current is made to flow in the diode at the time of accidental short-circuit without melting the lead wires due to the large current.

Briefly stated, the present invention comprises a power semiconductor device in which a power semiconductor active device and a diode are formed in parallel in the same semiconductor chip to have opposite polarities, a main electrode serving commonly as a first electrode of the power semiconductor active device and as a first electrode of the diode being formed on one surface of the semiconductor chip, a common main electrode serving commonly as a second electrode of the power semiconductor active device and as a second electrode of the diode being formed on another surface of the semiconductor chip and a plurality of outgoing lead wires being connected in the diode region of the common main electrode.

Accordingly, in the present invention, since a plurality of outgoing lead wires are connected in the diode region of the common main electrode, melting resistance of the lead wires can be improved by making the electric current flow in the diode at the time of an accidental short circuit and, as a result, problems resulting from the short circuit can be prevented in the peripheral transistor circuit.

In a preferred embodiment of the present invention, as a bipolar semiconductor active device, a power transistor a power MOS transistor or a thyristor may be employed.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 11:
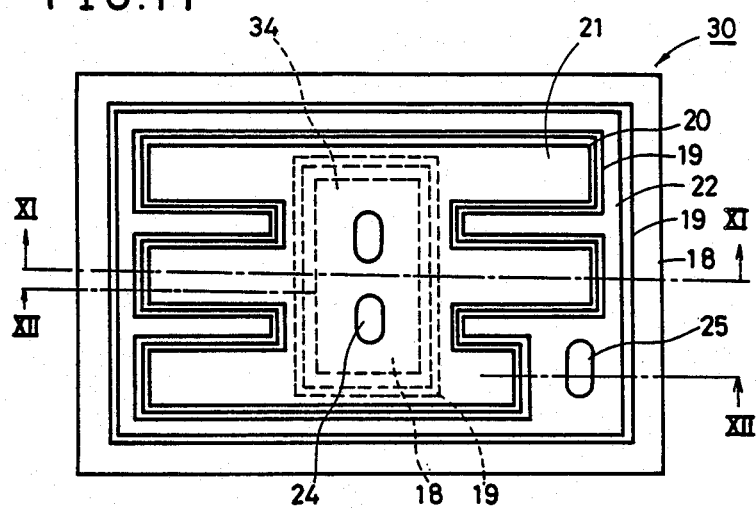
FIG. 11 is a plan view showing the structure of an embodiment of the present invention.
Figure 12:
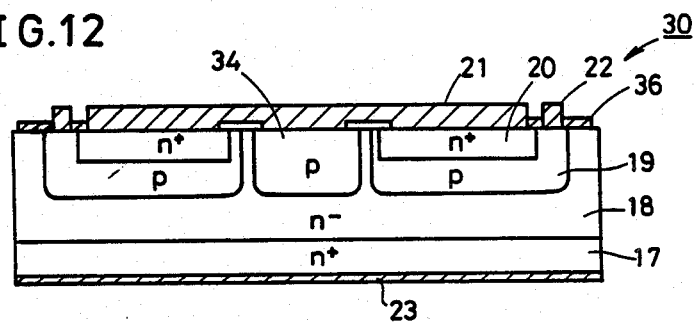
FIG. 12 is a vertical sectional view taken along the line XI—XI in FIG. 11.
Figure 13:
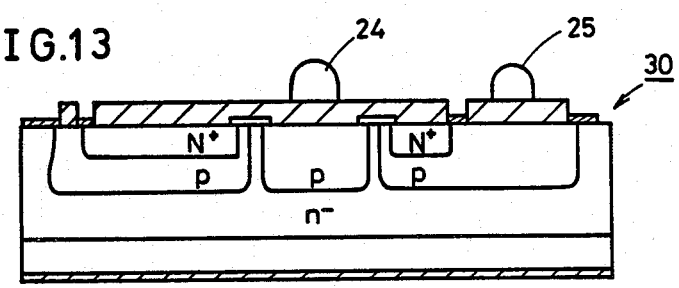
FIG. 13 is a vertical sectional view taken along the line XII—XII in FIG. 11.

Referring to FIGS. 11 to 13, a semiconductor device 30 comprises a collector low impurity concentration region 18 formed on a collector high impurity concentration region 17 and further comprises a base region 19 and an emitter region 20 formed successively thereon. An anode region 34 of a return current diode is formed within the collector region 18 in a manner surrounded by the base region 19. The collector regions 17 and 18 of a transistor serve also as a cathode of the return current diode. On one surface of the semiconductor chip 30, namely, on the side of the collector region 17, a collector electrode 23 is formed, and on another surface of the semiconductor chip 30, namely, on the side of the emitter region 20, an emitter electrode 21 is formed. The emitter electrode 21 serves also as an anode electrode of the return current diode and the collector electrode 23 serves also as a cathode electrode of the return current diode. Emitter lead wires 24 of the transistor serving also as anode lead wires of the return diode are connected at two points in the anode region 34 of the return current diode.

In the above semiconductor device, if a short circuit occurs, the lead wires generally do not melt simultaneously. They melt one after another beginning from the one in worst condition. It is well known that if lead wires are melted, the chip is melted in the contact portions of the lead wires and is sometimes caused to be broken. However, in the embodiment of the present invention, since two emitter lead wires 24 serving also as anode lead wires of the return current diode are connected in the anode region 34 of the return current diode, melting or breakage of the chip is provoked in the anode region 34 of the return current diode at the time of melting of the lead wires at an early stage. As a result, the subsequently flowing short-circuit current can be made to flow mainly in the diode region and accordingly melting resistance of the lead wires in the whole device can be improved. In addition, since the wire bonding region of the emitter electrode can be largely increased, melting resistance of the lead wires can be improved by increasing the number of wires.

Figure 14:
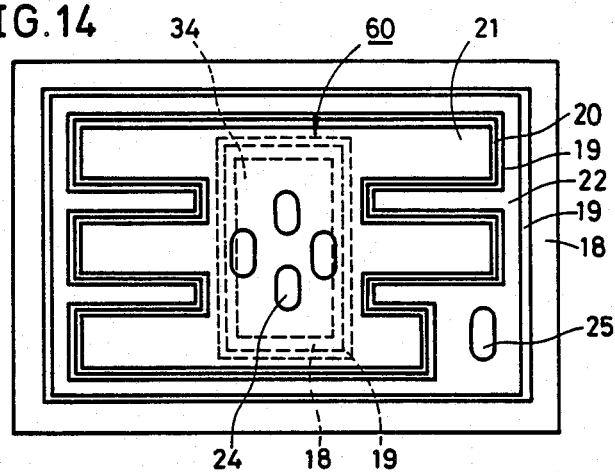
FIG. 14 is a plan view showing the structure of another embodiment of the present invention.

FIG. 14 is a plan view of another embodiment of the present invention. The FIG. 14 embodiment is generally the same as the FIG. 11 embodiment except that the number of emitter lead wires is increased and that contact portions having different distances to the emitter conduction region coexist. More specifically, the contact portion of a lead wire at a smaller distance to the emitter conduction region is more liable to be broken than the contact portion in the center of the diode region at a larger distance thereto and for this reason, the contact portion of a lead wire at the smaller distance to the emitter conduction region is first broken and the subsequent current is made to flow in the central portion of the broken diode whereby the lead wire melting resistance can be further improved as compared with the embodiment of FIG. 11.

Figure 15:
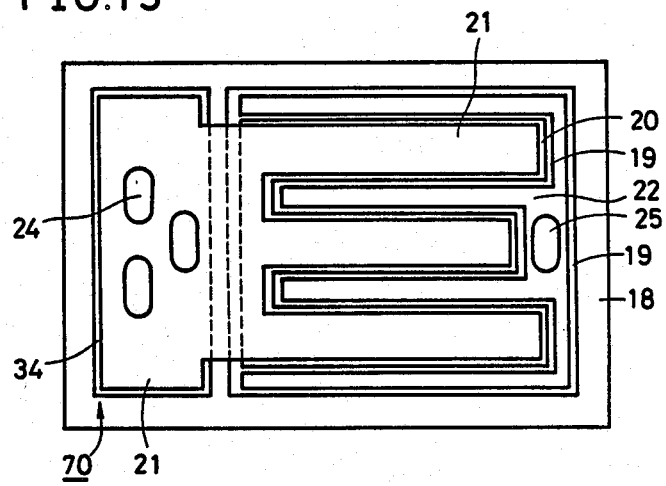
FIG. 15 is a plan view showing the structure of a further embodiment of the present invention.

FIG. 15 is a plan view of a further embodiment of the present invention. In the embodiments of FIGS. 11 and 14, the return current diode 60 is formed in the central portion of the emitter region 21, while in the FIG. 15 embodiment, a return current diode 70 is provided adjacent the emitter region 21, not in the central portion of the emitter region 21.

Thus, with the return current diode 70 provided adjacent the emitter region 21, surface efficiency of the chip can be increased in a device of relatively small electric power. More specifically, in the embodiments shown in FIGS. 11 and 14, the surface efficiency of the chip is lowered because a barrier serving as a border to the emitter region is formed around the return current diode which is disposed in the center of the emitter region, while in the embodiment shown in FIG. 15, a barrier is formed only on one side of the emitter region and accordingly the surface efficiency of the chip can be enhanced.

Figure 1:
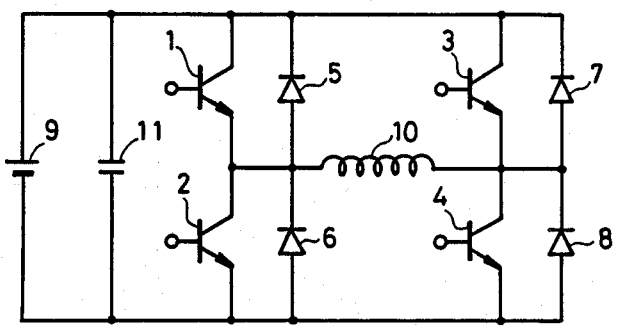
FIG. 1 is an electrical circuit diagram of an ordinary conventional inverter circuit.
Figure 2:
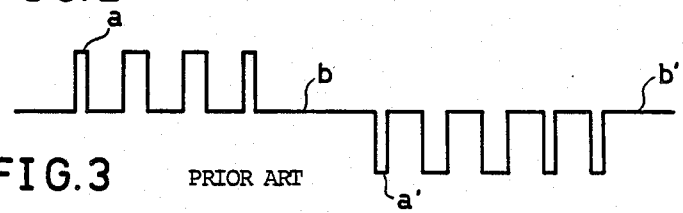
FIG. 2 is a waveform diagram for explaining the operation in FIG. 1.
Figure 3:
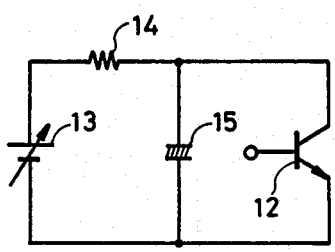
FIG. 3 is a circuit diagram of an apparatus for applying a lead wire melting test to a power transistor to be employed in the inverter circuit shown in FIG. 1.
Figure 4:
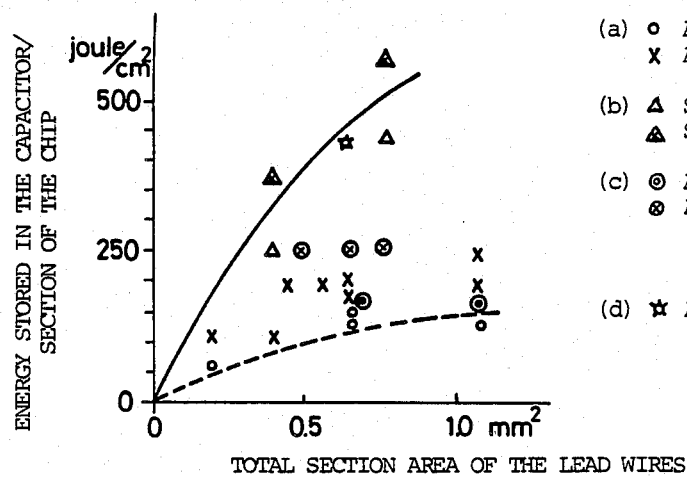
FIG. 4 is a graph showing the results of the lead wire melting test.
Figure 5:
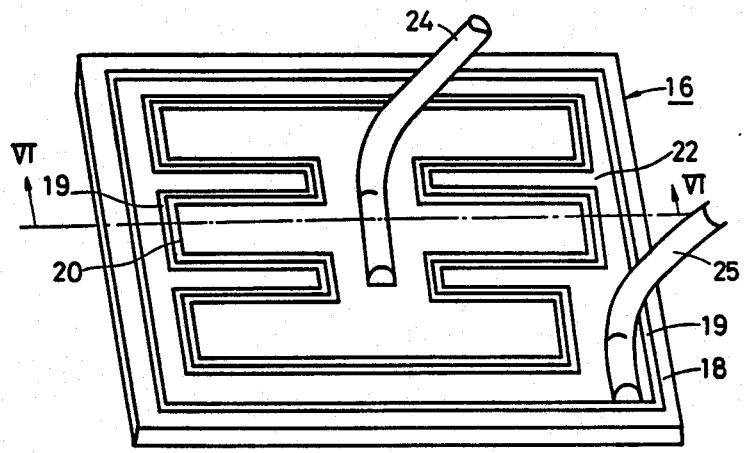
FIG. 5 is a perspective view showing an example of aluminum wire bonding in a conventional transistor.
Figure 6:
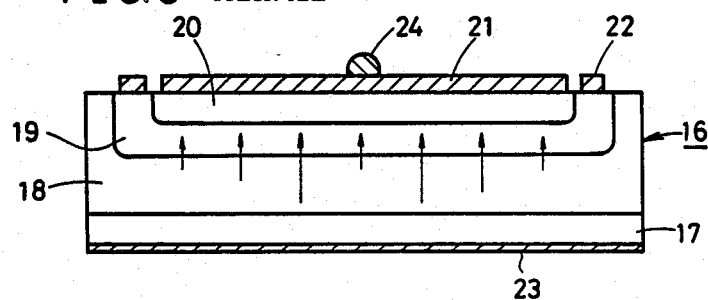
FIG. 6 is a vertical sectional view taken along the line VI—VI in FIG. 5.
Figure 7:
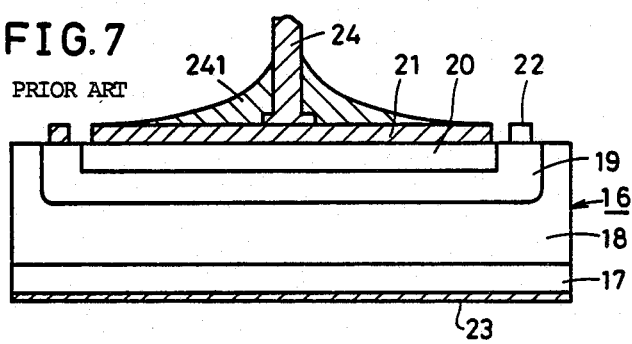
FIG. 7 is a vertical sectional view of a conventional transistor in which a lead wire is attached by soldering.
Figure 8:
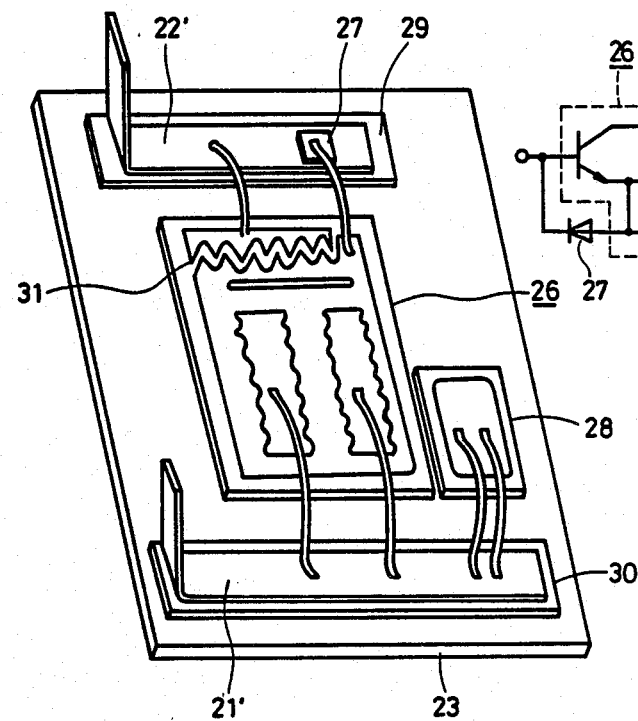
FIG. 8 is a perspective view showing an example in practical use of a conventional transistor for invertor.
Figure 9:
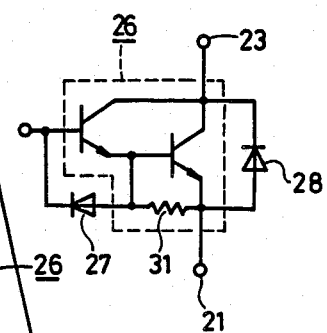
FIG. 9 is a diagram of an equivalent circuit.
Figure 10:
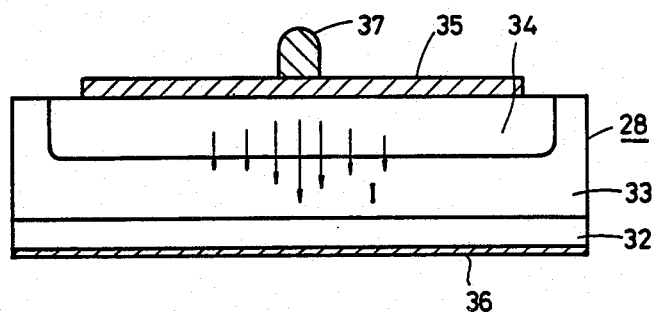
FIG. 10 is a sectional view of a return current diode.

As a result of applying a test to a device shown in FIG. 14 using the melting test apparatus shown in FIG. 3, it was made clear that in case of using aluminum lead wires, almost the same lead wire melting resistance as that in case of using silver lead wires can be obtained.

As described above, the embodiments shown in FIGS. 11 and 14 have a remarkable effect in an aluminum lead wire system. However, attachment of lead wires is not limited to the above described aluminum lead wire connection, and soldering or any other suitable method can be applied. Generally, if lead wires are soldered, lead wire melting resistance becomes increased and in the embodiments of the present invention, it is clear that if lead wires are connected by soldering instead of the aluminum lead wire connecting system, the melting resistance is further improved.

Although in the above described embodiments, a power semiconductor device comprising a combination of a transistor and a return current diode was applied, the present invention is not limited to this combination. It is clear that the same effect can be obtained with regard to the lead wire melting resistance at the time of a short circuit by applying a combination of a return current diode and a power MOS transistor, or a gate turn-off thyristor or a thyristor serving as a switching device employed in an inverter circuit in the same manner as in case of a transistor.

Figure 16:
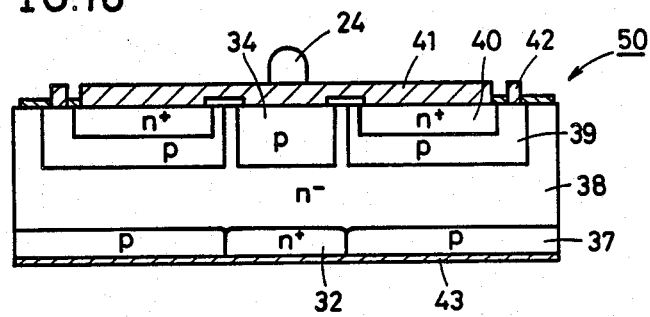
FIG. 16 is a vertical sectional view of a semiconductor chip in which a return diode and a thyristor or a gate turn-off thyristor are combined.

FIG. 16 is a vertical sectional view of a semiconductor chip comprising a combination of a return current diode and a thyristor or a gate turn-off thyristor. In the semiconductor chip 50 shown in FIG. 16, an anode region 34 of a return current diode is formed in the central portion of a thyristor comprising an anode region 37, a base region 38, a gate region 39 and a cathode region 40. On one surface of the semiconductor chip 50, namely, on the side of the anode region of the thyristor, an anode electrode 43 of the thyristor serving also as a cathode electrode of the diode is formed. On another surface of the semiconductor chip 50, namely, on the side of the cathode region of the thyristor and the anode region 34 of the return current diode, a cathode electrode 41 of the thyristor serving also as an anode electrode of the diode is formed. In the gate region 39 of the thyristor, a gate electrode 42 is formed. A lead wire 24 is connected in a portion on the cathode electrode 41 of the thyristor, corresponding to the anode electrode 34. As described above, in the chip 50 comprising a combination of the thyristor and a return current diode, the same effect as in the above described embodiments can also be obtained.

In case where a semiconductor device as described in the respective embodiments is applied to an inverter, it is to be noted that the return current diode to be employed needs to be a so-called high recovery diode suited for high frequency operation if the inverter is a high frequency inverter. For this reason, it is necessary to selectively provide life-time killers in the diode portions.

Manufacturing of these embodiments including formation of a diode and a switching device on the same chip can be made by adding or modifying relatively simple processes based on the selective diffusion technology.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power semiconductor device in which a power semiconductor active device and a diode are formed in antiparallel in a semiconductor chip having a one surface and an other surface, comprising:
    a main electrode formed on said one surface of said semiconductor chip, said main electrode functioning as a first electrode of both said device and said diode,
    a common main electrode formed on said other surface of said semiconductor chip to be opposed to said main electrode, said common main electrode serving as a second electrode of both said power semiconductor active device and said diode, and
    a plurality of outgoing lead wires connected to a diode region of said main electrode.

2. A power semiconductor device in accordance with claim 1, wherein
    said bipolar semiconductor active device is a power transistor,
    said first electrode of said power semiconductor active device is an emitter electrode, and
    said first electrode of said diode is an anode electrode.

3. A power semiconductor device in accordance with claim 1, wherein
    said power semiconductor active device is a power field effect transistor,
    said first electrode of said power semiconductor active device is a source electrode and
    said first electrode of said diode is an anode electrode.

4. A power semiconductor device in accordance with claim 1, wherein
    said power semiconductor device is a thyristor,
    said first electrode of said power semiconductor active device is a cathode electrode, and
    said first electrode of said diode is an anode electrode.

5. A power semiconductor device in accordance with claim 4, wherein
    said thyristor is a gate turn-off thyristor.

* * * * *